United States Patent
Ugolini et al.

(10) Patent No.: US 12,013,423 B2
(45) Date of Patent: Jun. 18, 2024

(54) TIA BANDWIDTH TESTING SYSTEM AND METHOD

(71) Applicant: MACOM Technology Solutions Holdings, Inc., Lowell, MA (US)

(72) Inventors: Jonathan Ugolini, Sophia-Antipolis (FR); Wim F. Cops, Le Rouret (FR)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/488,021

(22) Filed: Sep. 28, 2021

(65) Prior Publication Data

US 2022/0099716 A1 Mar. 31, 2022

Related U.S. Application Data (60) Provisional application No. 63/085,867, filed on Sep. 30, 2020.

(51) Int. Cl.
*G01R 23/02* (2006.01)
*H03F 3/45* (2006.01)

(52) U.S. Cl.
CPC ......... *G01R 23/02* (2013.01); *H03F 3/45475* (2013.01)

(58) Field of Classification Search
CPC ........ G01R 23/00; G01R 23/02; G01R 23/07; G01R 23/08; H03F 3/45475; H04B 10/07; H04B 10/693
See application file for complete search history.

(56) References Cited

U.S. PATENT DOCUMENTS

| 4,236,256 A | 11/1980 | Brackett |
| 4,297,527 A | 10/1981 | Pate |

(Continued)

FOREIGN PATENT DOCUMENTS

| EP | 0606161 | 4/2000 |
| EP | 1471671 | 12/2004 |

(Continued)

OTHER PUBLICATIONS

"An Introduction to DVD Recordable (DVD-R) What is DVD Recordable?" http://www.dvd-copy.com/reference/dvd_recordable.html, 2004, 8 pages.

(Continued)

*Primary Examiner* — Son T Le
*Assistant Examiner* — Matthew W. Baca
(74) *Attorney, Agent, or Firm* — Weide & Miller, Ltd.

(57) ABSTRACT

A system and method for testing the bandwidth of an amplifier by forcing the amplifier into an oscillation with a feedback signal. The oscillation frequency reveals the amplifier bandwidth. The system comprises an amplifier an input and an output, the amplifier output providing an amplifier output signal. A feedback system is configured to receive the amplifier output signal, process an amplifier output signal to create a feedback signal, provide the feedback signal to the amplifier input. Also part of this system is a frequency divider having an input connected to the amplifier output. The frequency divider is configured to reduce the frequency of the amplifier output signal to create a reduced frequency signal and provide the reduced frequency signal to test equipment which is configured to measure the frequency of the reduced frequency signal.

17 Claims, 4 Drawing Sheets

(56) References Cited

U.S. PATENT DOCUMENTS

| | | | |
|---|---|---|---|
| 4,415,803 A | 11/1983 | Muoi | |
| 4,488,305 A | 12/1984 | Claverie | |
| 4,534,064 A | 8/1985 | Giacometti et al. | |
| 4,545,076 A | 10/1985 | Biard | |
| 4,545,078 A | 10/1985 | Wiedeburg | |
| 4,574,249 A | 3/1986 | Williams | |
| 4,687,937 A | 8/1987 | Aagano et al. | |
| 4,709,416 A | 11/1987 | Patterson | |
| 4,719,643 A | 1/1988 | Beeman | |
| 4,734,914 A | 3/1988 | Yoshikawa | |
| 4,747,091 A | 5/1988 | Doi | |
| 4,805,236 A | 2/1989 | Urala | |
| 4,859,964 A | 8/1989 | Jorgensen | |
| 4,864,639 A * | 9/1989 | Dapore | H04B 1/16 455/226.4 |
| 4,864,649 A | 9/1989 | Tajima et al. | |
| 4,947,425 A | 8/1990 | Grizmala et al. | |
| 5,019,769 A | 5/1991 | Levinson | |
| 5,039,194 A | 8/1991 | Block et al. | |
| 5,057,932 A | 10/1991 | Lang | |
| 5,210,712 A | 5/1993 | Saito | |
| 5,293,405 A | 3/1994 | Gersbach et al. | |
| 5,321,849 A | 6/1994 | Lemson | |
| 5,334,826 A | 8/1994 | Sato et al. | |
| 5,383,046 A | 1/1995 | Tomofuji et al. | |
| 5,383,208 A | 1/1995 | Queniat et al. | |
| 5,392,273 A | 2/1995 | Masaki et al. | |
| 5,394,416 A | 2/1995 | Ries | |
| 5,396,059 A | 3/1995 | Yeates | |
| RE34,972 E | 6/1995 | Horiguchi et al. | |
| 5,448,629 A | 9/1995 | Bosch et al. | |
| 5,457,811 A | 10/1995 | Lemson | |
| 5,471,501 A | 11/1995 | Parr et al. | |
| 5,488,627 A | 1/1996 | Hardin et al. | |
| 5,491,548 A | 2/1996 | Bell et al. | |
| 5,510,924 A | 4/1996 | Terui et al. | |
| 5,532,471 A | 7/1996 | Khorramabadi et al. | |
| 5,557,437 A | 9/1996 | Sakai et al. | |
| 5,570,217 A | 10/1996 | Fleuren | |
| 5,574,435 A | 11/1996 | Mochizuki et al. | |
| 5,594,748 A | 1/1997 | Jabr | |
| 5,603,114 A | 2/1997 | Tomita | |
| 5,621,518 A | 4/1997 | Beller | |
| 5,636,254 A | 6/1997 | Hase et al. | |
| RE35,607 E | 9/1997 | Nagamune et al. | |
| 5,673,282 A | 9/1997 | Wurst | |
| 5,678,198 A | 10/1997 | Lemson | |
| 5,699,402 A | 12/1997 | Bauer et al. | |
| 5,710,660 A | 1/1998 | Yamamoto et al. | |
| 5,812,572 A | 9/1998 | King et al. | |
| 5,822,099 A | 10/1998 | Takamatsu | |
| 5,831,959 A | 11/1998 | Sakanushi | |
| 5,844,928 A | 12/1998 | Shastri et al. | |
| 5,872,468 A | 2/1999 | Dyke | |
| 5,884,231 A | 3/1999 | Perdue et al. | |
| 5,889,605 A | 3/1999 | Claverie | |
| 5,892,220 A | 4/1999 | Woodward | |
| 5,900,959 A | 5/1999 | Noda et al. | |
| 5,912,694 A | 6/1999 | Miyake | |
| 5,926,303 A | 7/1999 | Giebel et al. | |
| 5,943,152 A | 8/1999 | Mizrahi et al. | |
| 5,953,690 A | 9/1999 | Lemon | |
| 5,956,168 A | 9/1999 | Levinson et al. | |
| 5,963,901 A | 10/1999 | Vahatalo et al. | |
| 5,978,393 A | 11/1999 | Feldman et al. | |
| 6,005,240 A | 12/1999 | Krishnamoorthy | |
| 6,010,538 A | 1/2000 | Sun et al. | |
| 6,014,241 A | 1/2000 | Winter et al. | |
| 6,020,593 A | 2/2000 | Chow et al. | |
| 6,021,947 A | 2/2000 | Swartz | |
| 6,023,147 A | 2/2000 | Cargin, Jr. et al. | |
| 6,028,661 A | 2/2000 | Minami et al. | |
| 6,049,413 A | 4/2000 | Taylor et al. | |
| 6,064,501 A | 5/2000 | Roberts et al. | |
| 6,075,628 A | 6/2000 | Fisher et al. | |
| 6,081,362 A | 6/2000 | Hatakeyama | |
| 6,108,113 A | 8/2000 | Fee | |
| 6,111,687 A | 8/2000 | Tammela | |
| 6,115,113 A | 9/2000 | Flockencier | |
| H1881 H | 10/2000 | Davis et al. | |
| 6,160,647 A | 12/2000 | Gilliland et al. | |
| 6,175,434 B1 | 1/2001 | Feng | |
| 6,215,514 B1 | 4/2001 | Harris | |
| 6,259,293 B1 | 7/2001 | Hayase et al. | |
| 6,262,781 B1 | 7/2001 | Deter | |
| 6,282,017 B1 | 8/2001 | Kinoshita | |
| 6,292,497 B1 | 9/2001 | Nakano | |
| 6,317,062 B1 | 11/2001 | Payer et al. | |
| 6,333,895 B1 | 12/2001 | Hamamoto et al. | |
| 6,341,360 B1 | 1/2002 | Abdelilah et al. | |
| 6,366,373 B1 | 4/2002 | MacKinnon et al. | |
| 6,397,090 B1 | 5/2002 | Cho | |
| 6,423,963 B1 | 7/2002 | Wu | |
| 6,445,662 B1 | 9/2002 | Tonami | |
| 6,445,732 B1 | 9/2002 | Beamish | |
| 6,452,719 B2 | 9/2002 | Kinoshita | |
| 6,473,224 B2 | 10/2002 | Dugan et al. | |
| 6,494,370 B1 | 12/2002 | Sanchez | |
| 6,504,857 B1 | 1/2003 | Iwazaki | |
| 6,512,610 B1 | 1/2003 | Minami et al. | |
| 6,512,617 B1 | 1/2003 | Tanji et al. | |
| 6,534,997 B1 | 3/2003 | Horishita et al. | |
| 6,535,187 B1 | 3/2003 | Wood | |
| 6,542,228 B1 | 4/2003 | Hartog | |
| 6,547,453 B1 | 4/2003 | Stummer et al. | |
| 6,556,601 B2 | 4/2003 | Nagata | |
| 6,563,848 B1 | 5/2003 | Iwazaki | |
| 6,570,944 B2 | 5/2003 | Best et al. | |
| 6,580,328 B2 | 6/2003 | Tan et al. | |
| 6,593,810 B2 | 7/2003 | Yoon | |
| 6,597,485 B1 | 7/2003 | Ikeuchi | |
| 6,624,405 B1 | 9/2003 | Lau et al. | |
| 6,657,488 B1 | 12/2003 | King et al. | |
| 6,661,940 B2 | 12/2003 | Kim | |
| 6,704,008 B2 | 3/2004 | Naito et al. | |
| 6,707,492 B1 | 3/2004 | Itani | |
| 6,707,600 B1 | 3/2004 | Dijaili et al. | |
| 6,720,826 B2 | 4/2004 | Yoon | |
| 6,731,161 B1 | 5/2004 | O'Leary | |
| 6,737,924 B1 | 5/2004 | Paillet | |
| 6,740,864 B1 | 5/2004 | Dries | |
| 6,754,407 B2 | 6/2004 | Chakravorty | |
| 6,801,555 B1 | 10/2004 | Dijaili et al. | |
| 6,828,857 B2 | 12/2004 | Paillet et al. | |
| 6,836,493 B2 | 12/2004 | Mahowald et al. | |
| 6,837,625 B2 | 1/2005 | Schott et al. | |
| 6,852,966 B1 | 2/2005 | Douma et al. | |
| 6,862,047 B2 | 3/2005 | Hibi | |
| 6,864,751 B1 | 3/2005 | Schmidt et al. | |
| 6,868,104 B2 | 3/2005 | Stewart et al. | |
| 6,873,279 B2 | 3/2005 | Jones et al. | |
| 6,879,217 B2 | 4/2005 | Visocchi | |
| 6,885,954 B2 | 4/2005 | Jones et al. | |
| 6,888,123 B2 | 5/2005 | Douma et al. | |
| 6,909,731 B2 | 6/2005 | Lu | |
| 6,915,076 B1 | 7/2005 | Mittal | |
| 6,934,307 B2 | 8/2005 | DeCusatis et al. | |
| 6,934,479 B2 | 8/2005 | Sakamoto et al. | |
| 6,941,077 B2 | 9/2005 | Aronson et al. | |
| 6,952,531 B2 | 10/2005 | Aronson et al. | |
| 6,956,643 B2 | 10/2005 | Farr et al. | |
| 6,957,021 B2 | 10/2005 | Aronson et al. | |
| 6,967,320 B2 | 11/2005 | Chieng et al. | |
| 7,005,901 B1 | 2/2006 | Jiang et al. | |
| 7,031,574 B2 | 4/2006 | Huang et al. | |
| 7,039,082 B2 | 5/2006 | Stewart et al. | |
| 7,046,721 B2 | 5/2006 | Grohn | |
| 7,049,759 B2 | 5/2006 | Roach | |
| 7,050,720 B2 | 5/2006 | Aronson et al. | |
| 7,058,310 B2 | 6/2006 | Aronson et al. | |
| 7,065,114 B2 | 6/2006 | Hishiyama | |
| 7,066,746 B1 | 6/2006 | Togami et al. | |
| 7,079,775 B2 | 7/2006 | Aronson et al. | |
| 7,106,769 B2 | 9/2006 | Fairgrieve | |

(56) References Cited

U.S. PATENT DOCUMENTS

| | | |
|---|---|---|
| 7,127,391 B2 | 10/2006 | Chang |
| 7,181,100 B2 | 2/2007 | Douma et al. |
| 7,184,671 B2 | 2/2007 | Wang |
| 7,193,957 B2 | 3/2007 | Masui et al. |
| 7,206,023 B2 | 4/2007 | Belliveau |
| 7,215,891 B1 | 5/2007 | Chiang et al. |
| 7,227,916 B2 | 6/2007 | Ruelke et al. |
| 7,233,206 B2 | 6/2007 | Murakami et al. |
| 7,236,108 B2 | 6/2007 | Cheng |
| 7,265,334 B2 | 9/2007 | Draper et al. |
| 7,269,194 B2 | 9/2007 | Diaz et al. |
| 7,276,682 B2 | 10/2007 | Draper et al. |
| 7,357,513 B2 | 4/2008 | Watson et al. |
| 7,381,935 B2 | 6/2008 | Sada et al. |
| 7,400,662 B2 | 7/2008 | Robinson |
| 7,403,064 B2 | 7/2008 | Chou et al. |
| 7,453,475 B2 | 11/2008 | Nitta et al. |
| 7,456,690 B2 | 11/2008 | Kocaman |
| 7,474,720 B2 | 1/2009 | Yuuki et al. |
| 7,502,400 B2 | 3/2009 | Preisach |
| 7,504,610 B2 | 3/2009 | Draper |
| 7,505,498 B2 | 3/2009 | Sanchez |
| 7,536,114 B2 | 5/2009 | Gieseler |
| 7,616,700 B2 | 11/2009 | Kim |
| 7,684,531 B2 | 3/2010 | Masui et al. |
| 7,701,833 B2 | 4/2010 | Kim |
| 7,734,309 B2 | 6/2010 | Chi et al. |
| 7,738,602 B2 | 6/2010 | Langenbach |
| 7,741,908 B2 | 6/2010 | Furuta |
| 7,778,294 B2 | 8/2010 | Nishimura et al. |
| 7,949,025 B2 | 5/2011 | Olea |
| 7,978,007 B2 | 7/2011 | Tiiliharju |
| 7,978,985 B2 | 7/2011 | Zheng |
| 8,005,372 B2 | 8/2011 | Takahara |
| 8,059,020 B2 | 11/2011 | Schatzberger |
| 8,094,692 B2 | 1/2012 | Nakamura |
| 8,200,100 B2 | 6/2012 | De Langen |
| 8,231,284 B2 | 7/2012 | Doany |
| 8,260,155 B2 | 9/2012 | Inoue |
| 8,396,110 B1 | 3/2013 | Hsieh |
| 8,548,110 B2 | 10/2013 | Lin et al. |
| 8,548,336 B2 | 10/2013 | Nuttgens |
| 8,571,079 B1 | 10/2013 | Nguyen |
| 8,754,711 B2 | 6/2014 | Welch |
| 8,872,487 B2 | 10/2014 | Belloni |
| 8,958,512 B1 | 2/2015 | Ding |
| 8,970,300 B2 | 3/2015 | Piepenstock |
| 9,064,981 B2 | 6/2015 | Laforce |
| 9,232,902 B2 | 1/2016 | Takahashi |
| 9,246,450 B2 | 1/2016 | Schacht et al. |
| 9,419,410 B2 | 8/2016 | Usuki |
| 9,853,735 B1 | 12/2017 | Lin |
| 10,097,147 B2 | 10/2018 | Lin |
| 10,495,831 B2 | 12/2019 | Gupta |
| 10,641,823 B2 | 5/2020 | Lu et al. |
| 2001/0046243 A1 | 11/2001 | Schie |
| 2002/0015305 A1 | 2/2002 | Bornhorst et al. |
| 2002/0064193 A1 | 5/2002 | Diaz |
| 2002/0085600 A1 | 7/2002 | Jung |
| 2002/0105982 A1 | 8/2002 | Chin et al. |
| 2002/0114383 A1 | 8/2002 | Belge et al. |
| 2002/0130977 A1 | 9/2002 | Hibi |
| 2002/0140378 A1 | 10/2002 | Volk et al. |
| 2002/0153949 A1 | 10/2002 | Yoon |
| 2002/0181533 A1 | 12/2002 | Vail |
| 2003/0030756 A1 | 2/2003 | Kane et al. |
| 2003/0043869 A1 | 3/2003 | Vaughan |
| 2003/0053003 A1 | 3/2003 | Nishi et al. |
| 2003/0067662 A1 | 4/2003 | Brewer |
| 2003/0122057 A1 | 7/2003 | Han et al. |
| 2003/0165168 A1 | 9/2003 | Murata |
| 2004/0001538 A1 | 1/2004 | Garrett |
| 2004/0032890 A1 | 2/2004 | Murata |
| 2004/0047635 A1 | 3/2004 | Aronson et al. |
| 2004/0095976 A1 | 5/2004 | Bowler et al. |
| 2004/0114650 A1 | 6/2004 | Tanaka |
| 2004/0136727 A1 | 7/2004 | Androni et al. |
| 2004/0160996 A1 | 8/2004 | Giorgi |
| 2004/0188717 A1 | 9/2004 | Ono |
| 2004/0202215 A1 | 10/2004 | Fairgrieve |
| 2004/0240041 A1 | 12/2004 | Tian |
| 2004/0258115 A1 | 12/2004 | Murata |
| 2005/0024142 A1 | 2/2005 | Sowlati |
| 2005/0062530 A1 | 3/2005 | Bardsley |
| 2005/0105574 A1 | 5/2005 | Wu et al. |
| 2005/0168319 A1 | 8/2005 | Bhattacharya et al. |
| 2005/0180280 A1 | 8/2005 | Hoshino |
| 2005/0185149 A1 | 8/2005 | Lurkens et al. |
| 2005/0215090 A1 | 9/2005 | Harwood |
| 2005/0243879 A1 | 11/2005 | Horiuchi |
| 2005/0244167 A1 | 11/2005 | Liew |
| 2006/0034621 A1 | 2/2006 | Denoyer |
| 2006/0067712 A1 | 3/2006 | Draper |
| 2006/0098699 A1 | 5/2006 | Sanchez |
| 2006/0114954 A1 | 6/2006 | Wong et al. |
| 2006/0125557 A1 | 6/2006 | Manstretta |
| 2006/0126683 A1 | 6/2006 | Kang |
| 2006/0153256 A1 | 7/2006 | Sanchez |
| 2006/0165139 A1 | 7/2006 | Sanchez |
| 2006/0192899 A1 | 8/2006 | Ogita |
| 2006/0239308 A1 | 10/2006 | Husain |
| 2006/0261893 A1 | 11/2006 | Chiang et al. |
| 2006/0278813 A1 | 12/2006 | Iesaka |
| 2006/0280211 A1 | 12/2006 | Garez |
| 2007/0047602 A1 | 3/2007 | Tanaka |
| 2007/0058089 A1 | 3/2007 | Wang |
| 2007/0081130 A1 | 4/2007 | May et al. |
| 2007/0098026 A1 | 5/2007 | Uesaka et al. |
| 2007/0098416 A1 | 5/2007 | Nogami |
| 2007/0159434 A1 | 7/2007 | Yen et al. |
| 2007/0195208 A1 | 8/2007 | Miyazawa et al. |
| 2007/0202831 A1* | 8/2007 | Schultheiss ........... H04L 27/144 |
| | | 455/312 |
| 2007/0229718 A1 | 10/2007 | Hall |
| 2007/0263685 A1 | 11/2007 | Takasou |
| 2007/0280388 A1 | 12/2007 | Torre |
| 2007/0286609 A1 | 12/2007 | Ikram et al. |
| 2007/0286611 A1 | 12/2007 | Weber |
| 2008/0012508 A1 | 1/2008 | Steele et al. |
| 2008/0024469 A1 | 1/2008 | Damera-Venkata et al. |
| 2008/0055005 A1 | 3/2008 | Nam et al. |
| 2008/0074562 A1 | 3/2008 | Endo et al. |
| 2008/0112711 A1 | 5/2008 | Inoue |
| 2008/0112712 A1 | 5/2008 | Inoue |
| 2008/0205907 A1 | 8/2008 | Kim |
| 2008/0231209 A1 | 9/2008 | Shiwaya et al. |
| 2008/0246893 A1 | 10/2008 | Boss et al. |
| 2008/0303499 A1 | 12/2008 | Chen et al. |
| 2008/0304559 A1 | 12/2008 | Wu |
| 2008/0309407 A1 | 12/2008 | Nakamura et al. |
| 2009/0110409 A1 | 4/2009 | Zou et al. |
| 2009/0148094 A1 | 6/2009 | Kucharski et al. |
| 2009/0238226 A1 | 9/2009 | Moto |
| 2010/0013598 A1* | 1/2010 | Greene ................ G06K 7/0008 |
| | | 340/10.1 |
| 2010/0027611 A1 | 2/2010 | Dai |
| 2010/0105574 A1 | 4/2010 | Hansford et al. |
| 2010/0164396 A1 | 7/2010 | Lindeberg et al. |
| 2010/0172384 A1 | 7/2010 | Groepl |
| 2010/0183318 A1 | 7/2010 | Tanaka |
| 2010/0313855 A1* | 12/2010 | Kassner .................... F02C 6/12 |
| | | 123/564 |
| 2010/0330687 A1* | 12/2010 | Afzali-Ardakani ........................ |
| | | H01L 29/0665 |
| | | 977/956 |
| 2011/0062874 A1 | 3/2011 | Knapp |
| 2011/0316632 A1 | 12/2011 | Takemoto |
| 2012/0002712 A1 | 1/2012 | Hayami |
| 2012/0201260 A1 | 8/2012 | Nguyen et al. |
| 2012/0213531 A1 | 8/2012 | Nazarathy |
| 2013/0195224 A1* | 8/2013 | Xu ...................... H04L 27/2071 |
| | | 375/328 |
| 2014/0023374 A1 | 1/2014 | Yuda |
| 2014/0063593 A1 | 3/2014 | Berendt |

(56) References Cited

U.S. PATENT DOCUMENTS

| | | |
|---|---|---|
| 2014/0226147 A1 | 8/2014 | Metzler |
| 2014/0233594 A1 | 8/2014 | Kubo |
| 2014/0320212 A1 | 10/2014 | Kalantari et al. |
| 2015/0263625 A1 | 9/2015 | Lee |
| 2016/0070123 A1 | 3/2016 | Tatsumi |
| 2016/0072462 A1 | 3/2016 | Itabashi et al. |
| 2016/0134081 A1 | 5/2016 | Louderback |
| 2017/0085057 A1 | 3/2017 | Barnes |
| 2017/0288369 A1 | 10/2017 | Ikram et al. |
| 2018/0095119 A1* | 4/2018 | Chillara ............ G01R 23/02 |
| 2018/0262373 A1 | 9/2018 | Shibasaki |
| 2020/0162169 A1 | 5/2020 | Papanikolaou |
| 2021/0242945 A1 | 8/2021 | Papanikolaou et al. |

FOREIGN PATENT DOCUMENTS

| | | |
|---|---|---|
| JP | 5-152660 | 6/1993 |
| JP | 2004-045989 | 2/2004 |
| JP | 2001-119250 | 4/2015 |
| WO | WO 93/21706 | 10/1993 |
| WO | WO 02/063800 | 8/2002 |
| WO | WO 2004/098100 | 11/2004 |
| WO | WO 2019/015325 | 1/2024 |

OTHER PUBLICATIONS

"An Introduction to DVD-RW", DVD White Paper, Pioneer New Media Technologies, Inc., Feb. 8, 2001, 8 pages.

"CD Basics: The Bumps", Howstuffworks "How CD Burners Work", http://entertainment.howstuffworks.com/cd-burner1.htm, 2004, 3 pages.

"Linear Technology LCT 3533 2A Wide Input Voltage Synchronous Buck-Boost DC/DC Converter", © Linear Technology Corporation 2007, 16 pages.

"National Semiconductor LM 3549 High Power Sequential LED Driver", © 2010 National Semiconductor Corporation, www.national.com, Aug. 3, 2010, 20 pages.

"TPS63020 TPS63021 High Efficiency Single Inductor Buck-Boost Converter With 4-A Switches", Texas Instruments, Copyright © 2010, Texas Instruments Incorporated, Apr. 2010, 28 pages.

"Current mirror" Wikipedia, the free encyclopedia, http://en.wikipedia.org/wiki/Current_mirror, May 22, 2011, 8 pages.

"LCT3454-1A Synchronous Buck-Boost High Current LED Driver" Linear Technology, http://www.linear.com/prodnct/LTC3454 @Linear Technology, 12 pages.

"LT3476-High Current Quad Output LED Driver" Linear Technology, https://www.linear.com/product/LT3476, @2010 Linear Technology, 14 pages.

"Mosfet"Wikipedia, the free encyclopedia.http://en.wikipeida.org/wiki/MOSFET, May 27, 2011, 24 pages.

"PLL Design", http://members.innet.net.au/☐richardh/PPH.htm, 9 pages.

"Power Management, LED- driver considerations" Analog and Mixed-Signal Products, Analog Applications Journal, www.ti.com/sc/analogapps, Texas Instruments Incorporated, @2005 Texas Instruments Incorporated, Michael Day, 5 pages.

A Low Noise, Wide Dynamic Range, Transimpedance Amplifier with Automatic Gain Control for SDH/SONET (STM16/OC48) in a 30GHz ft BiCMOS Process, Mihai A. T., Sanduleanu, Philips Research Eindhoven, Paul Manteman, Philips Semiconductors Nijmegen, date unknown.

Abhijit Phanse, National Semiconductor, "Exercise 2: Define the time variance of a fiber optic channel's Impulse Response, and suggest a method for measuring it", IEEE 802.3ae, Nov. 2000, 13 pages.

Analog Devices, Background information about wireless communications. Date unknown.

Dr. John Rilum, "Mastering Beyond DVD Density", http://www.optical-disc.com/beyonddvd.html, 2002, 7 pages.

Garth Nash, "AN535 Application Notes—Phase-Locked Loop Design Fundamentals", Motorola, Inc., 1994, 3 pages.

Jaime Bailey "How DVD Works", http://sweb.uky.edu/~jrbai101/dvd.htm, May 1999, 6 pages.

Keith Szolusha, "Linear Technology Design Notes DC/DC Converter Drives Lumileds White LEDs from a Variety of Power Sources-Design Note 340", Linear Technology Corporation, © Linear Technology Corporation 2004, date unknown, 2 pages.

Kim, "Dual Output Transimpedance Amplifier of Cost Effective CMOS Optical Receiver for Digital Audio Interfaces" Circuits and Systems, 2007. ISCAS 2007. IEEE International Symposyum.

Miller Effect—Wikipedia, the free encyclopedia, http://en.wikipedia.org/wiki/Miller_effect, Mar. 9, 2015.

P.M. Crespo Bofil, G. Shing Liu, C. Ho Wei. Combine baud-rate timing recovery and adaptive equalization for high rate data transmission in digital subscriber lines. In Comunicaciones de Telefonica γ Desarrollo, vol. 41, No. 7, Jun. 1993. http://www.tid.es/presencia/publicaciones/comsid/esp/articulos/vol41/combi/combi.html.

Richard Wilkinson "Topic: Selecting the Right DVD Mastering Technique", DVD Technology Update, http://www.optical-disc.com/dvdupdate.html, 2002, 8 pages.

Ron Bertrand, "The Basics of PLL Frequency Synthesis", Online Radio & Electronics Course, Apr. 2002, 9 pages.

Single-Ended vs. Differential Methods of Driving a Laser Diode, Maxim Integrated™, Application Note: HFAN-2.5.0, Rev. 5; Oct. 2008, 5 pages.

Tuan "Solace" Nguyen, "CD, CD-R, CD-RW, DVD, DD-RAM, DVD-RW, and MO", Tweak3D.Net-Your Freakin' Tweakin Source!, http://www.tweak3d.net/articles/opticals/, May 13, 2000, 7 pages.

* cited by examiner

FIG. 5

TIA BANDWIDTH TESTING SYSTEM AND METHOD

FIELD OF THE INVENTION

The invention relates to transimpedance amplifier testing, and in particular to a method and apparatus to determine TIA bandwidth.

RELATED ART

Bandwidth is one of the most important parameters for TIAs (transimpedance amplifier) as it describes the ability of the device to amplify a signal at a given data rate. Because of the importance of the bandwidth on the overall performance of the TIA, there is a great advantage of being able to efficiently measure it during testing so it can be screened or tuned before shipping to customers.

Unfortunately, as it is a high-speed parameter, the way it was measured in the prior art required a high-speed setup that is not compatible with or too expensive for automated testing production machines. As a result, in the prior art, bandwidth was not tested during production or before shipping to customers. This results in some products being shipped which may not meet minimum bandwidth requirements.

SUMMARY

To overcome the drawbacks of the prior art and provide additional advantages, a system for testing the bandwidth of an amplifier is disclosed. In one embodiment, the system comprises an amplifier having an input and an output. The amplifier output provides an amplifier output signal from the amplifier. A feedback system connects to the amplifier input and the amplifier output. The feedback system is configured to receive the amplifier output signal, process the output signal to create a feedback signal that forces the amplifier to oscillate, and provide the feedback signal to the amplifier input. Also part of this embodiment is a frequency divider system having an input connected to the amplifier output. The frequency divider system is configured to reduce the frequency of the amplifier output signal to create a reduced frequency signal, and to provide the reduced frequency signal to test equipment which is configured to measure the frequency of the reduced frequency signal.

In one embodiment, the amplifier is a transimpedance amplifier. The feedback system may be configured to provide an in-phase or partly in-phase version of the amplifier output to the amplifier input as the feedback signal. As a result, the feedback signal provided to the amplifier input forces the amplifier to oscillate, such that the oscillation rate is determined by the bandwidth of the amplifier. This system may further comprise a frequency detector configured to receive and determine a frequency of the reduced frequency signal, such that the frequency of the reduced frequency signal is related to the bandwidth of the amplifier. It is contemplated that the system may further comprise a summing junction configured to combine the amplifier input and the feedback signal.

Also disclosed is a method for testing the bandwidth of an amplifier comprising providing an amplifier having an amplifier input and output. Then, biasing the amplifier and generating an amplifier output signal. The method then processes the amplifier output signal to generate a feedback signal. The feedback signal comprises an in-phase, or partly in-phase, version of the amplifier output signal. The feedback signal is provided to the amplifier input to cause the amplifier to oscillate to thereby generate an oscillating amplifier output. Then, detecting or determining the frequency of the oscillating amplifier output to determine bandwidth of the amplifier.

This method may further comprise dividing the frequency of the oscillating amplifier output by a dividing value to create a reduced frequency signal, and then detecting the frequency of the reduced frequency signal, such that the frequency of the reduced frequency signal is related to the bandwidth of the amplifier. In one embodiment, this method further includes multiplying the frequency of the reduced frequency signal by the dividing value to calculate the frequency of the oscillating amplifier output which determines the bandwidth of the amplifier. In one configuration, the amplifier comprises a transimpedance amplifier. This method may occur after manufacture to test and characterize the amplifier.

Also disclosed is a system for generating a signal that represents an amplifier's bandwidth comprising a feedback system and a frequency divider. The feedback system is connected to the amplifier input and output. The feedback system is configured to provide feedback to the amplifier input to force the amplifier to oscillate at an oscillation frequency. The frequency divider system has an input connected to the amplifier output and is configured to reduce the frequency of the amplifier output signal to create a reduced frequency signal. The reduced frequency signal may be provided to test equipment configured to measure the frequency of the reduced frequency signal such that the oscillation frequency represents the amplifier bandwidth.

The feedback system may be configured to provide an in-phase or partly in-phase version of the amplifier output to the amplifier input as the feedback signal to force oscillation of the amplifier. The oscillation rate of the amplifier is determined by the bandwidth of the amplifier. Also part of this embodiment, may be a frequency detector configured to receive and determine a frequency of the reduced frequency signal, such that the frequency of the reduced frequency signal is related to the bandwidth of the amplifier. A summing junction may be configured to combine the amplifier input and the feedback signal. In one configuration, the feedback circuit comprises a combination of any passive elements, active elements or both.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
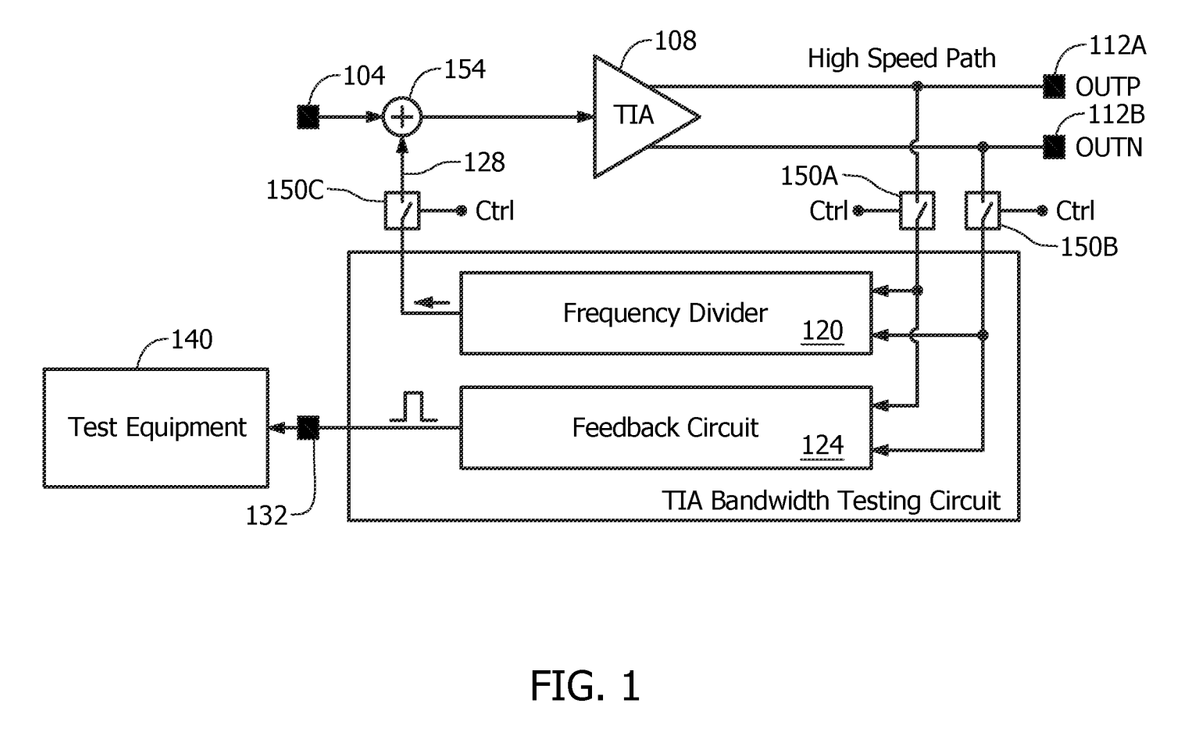
FIG. 1 is a block diagram illustrating an example embodiment of the TIA bandwidth test system.

The innovation includes a novel method to test the bandwidth of a TIA at the time of production and at a low cost with rapid throughput. FIG. 1 illustrates an example system having a high-speed path and a TIA bandwidth testing circuit. In this example embodiment, an input 104 connects to the TIA 108. A switch, not shown, may be in series with the input to selectively connect and disconnect the input 104 from the TIA. The TIA 108 has a positive phase output (output P) 112A and a negative phase output (output N) 112B as shown. The two outputs 112A, 112B may be 180 degrees out of phase. The output P 112A connects to a feedback circuit 120 and a frequency divider circuit 124. The output N 112B also connects to the feedback circuit 120 and the frequency divider circuit 124.

The feedback circuit 120 provides a feedback signal on path 128 to a switch 150C, which in turn connects to a summing junction 154, which also receives the input 104 of the TIA 108. Switch 150C operates in the same manner as switches 150A, 150B which are described herein. The input signal to the TIA is amplified by the TIA and presented on the outputs 112A, 112B. The feedback circuit 120 may be any combination of any passive elements, active elements or both that are configured to provide an in-phase or partly in-phase feedback signal to the TIA 108. The feedback circuit and the resulting feedback is configured to cause the TIA to oscillate.

In electronics a transimpedance amplifier (TIA) is a type of current-to-voltage converter, often implemented with one or more operational amplifiers (op-amps). A TIA is used to amplify the current output tubes, photomultiplier tubes, accelerometers, photodetectors and other types of sensors to a usable voltage. The transimpedance amplifier presents a low impedance to the photodiode and isolates it from the output voltage of the operational amplifier. There are several different configurations of transimpedance amplifiers, each suited to a particular application. The one factor they all have in common is the requirement to convert the low-level current of a sensor to a voltage. The gain, bandwidth, as well as input offset current and input offset voltages change with different types of sensors, requiring different configurations of transimpedance amplifiers.

The frequency divider 124 receives both of the outputs 112A, 112B, and divides the frequency of one or both to create a lower frequency signal. In one embodiment the analog output of the TIA is provided directly to the frequency divider 124, while in another embodiment the TIA output is converted into a digital signal prior to processing by the frequency divider. Because of the very high frequency of the TIA output, presenting the TIA output to the frequency divider 124 in analog form avoids use of complex and expensive ultra-high-speed analog to digital converts. The frequency divider circuit 124 may be any configuration which functions to divide or scale down the frequency presented at its input. A reduced frequency representation of the TIA output is presented on the frequency divider output 132.

Between the frequency divider 124 and the TIA outputs 112A, 112B are switches 150A, 150B which selectively connect and disconnect the TIA bandwidth testing circuit from the high-speed signal path. Control signals control the switches such that during testing the TIA bandwidth testing circuit is connected to the high speed signal path and during normal operation, such as when installed in the field, the testing circuit is disconnected from the high speed path. When not in test mode, the TIA bandwidth testing circuit is powered down. The testing circuit may be integrated into the same integrated circuit as the TIA, or a separate device which connects to the highspeed path.

A frequency divider, also called a clock divider or scaler or pre-scaler, is a circuit that takes an input signal of a frequency F1 and generates an output signal F2 of a frequency that is reduced by a value N such that F2=F1/N where N is an integer, or in some embodiment a positive real number. Frequency dividers generate a signal having a frequency that is a multiple of a reference frequency. Frequency dividers can be implemented for both analog and digital applications.

In operation, during a testing sequence, no input signal is presented to the input 104 of the TIA 108 but the TIA is biased. The output signals from the TIA are fed back through the feedback circuit 120 with a phase and magnitude that establishes feedback to the TIA 108, which forces the TIA output to become unstable and oscillate. This unstable feedback loop is maintained until the oscillations reach a steady rate of oscillation which is the TIA oscillation rate. The oscillation may be a square wave or sine wave, or any other type of periodic signal pattern.

The output of the TIA 108 is also provided to the frequency divider which scales down the oscillation frequency rate at a known value. By scaling down the frequency with the frequency divider 124, the frequency of the frequency divider output signal is measurable using low cost equipment. Once measured, the measured frequency may be multiplied by the dividing factor applied by the frequency divider circuit 124 to determine the actual frequency of the TIA output oscillations. The TIA oscillation frequency is the bandwidth of the TIA 108.

This innovation creates an unstable system between a TIA 108 output 112A, 112B and its input due to feedback from a feedback circuit 120. Choosing or controlling the polarity of feedback on path 128 will force the system to oscillate. In one configuration, the system is configured to identify where the phase is zero, then analyze the loop gain at this point and, if at that point the loop gain is greater than one, then an oscillation will be established. Due to the feedback, the oscillation become unstable, ramping up to the TIA's maximum oscillation rate. As the system is kept linear, the frequency of the oscillation is correlated to the signal path poles and therefore to the TIA bandwidth. The frequency of the oscillation is generally too high to be easily measured. Therefore, a frequency divider 124 is implemented between the signal path output and the test pin 132. In one embodiment, test equipment 140 connects to the test pin 132. The test equipment 140 is configured to detect and determine the frequency of the signal on the test pin 132. Suitable test equipment 140 is known by those of ordinary skill in the art and as such, it is not discussed in detail herein. The resulting measured frequency is an image of (represents) the TIA bandwidth, such that the measured frequency value is scaled upward by the dividing factor applied by the frequency divider to calculate the TIA bandwidth. One example environment of use of the TIA test system disclosed herein is at production level with automated testing production machines.

Figure 2:
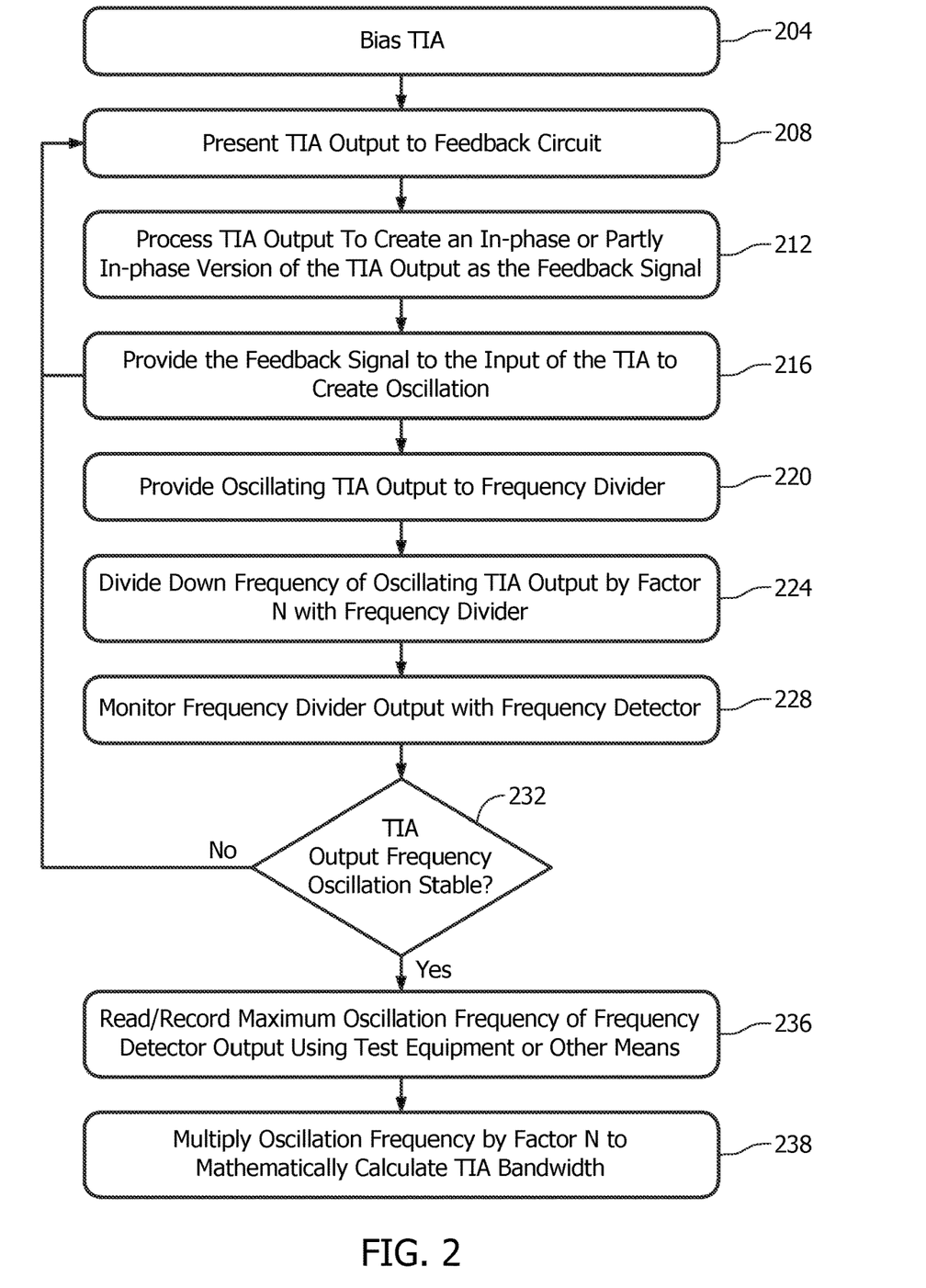
FIG. 2 illustrates an operational flow diagram of one example method of operation.

FIG. 2 illustrates an operational flow diagram of one example method of operation. This is but one possible method of operation, and that claims the follow are not limited to this exact implementation. At a step 204 the TIA is provided and biased as is understood in the art. At a step 208, the TIA output signal, from the TIA output port(s) is provided to a feedback circuit. At a step 212 the feedback circuit processes the TIA output to create an in-phase or partly in-phase version of the TIA output to be used as a feedback signal. In other embodiments, other type processing or other type signal(s) may be used as a feedback signal to force the TIA to generate an oscillating output.

Next, at a step 216, the feedback circuit output is fed back to the input of the TIA. From step 216 the operation branches and returns to step 208 and also progresses to step 220. The feedback signal presented to the TIA causes the TIA output to oscillate such as if the TIA were unstable. At a step 220, the oscillating TIA output is provided to a frequency divider.

At a step 224, the frequency divider divides down the frequency of the oscillating TIA output by a factor N. This may occur because the high frequency oscillations may otherwise be difficult to accurately detect or may require an expensive frequency detector. Then, at step 228 the output of the frequency divider is monitored with a frequency detector or other equipment capable of determining frequency of a signal.

Then, at a decision step 232, a determination is made regarding whether the TIA output frequency oscillation is stable. If it is not stable, then the operation returns to step 208 as shown. Alternatively, if at decision step 232 it is determined that the oscillation frequency is stable, then the operation advances to step 236. At step 236 the frequency detector (connected to output 132 of FIG. 1) reads and records the oscillation frequency of the TIA output as divided by the factor N. To determine the oscillation frequency, the recorded frequency is multiplied by the factor N, which reveals the bandwidth of the TIA.

Figure 3:
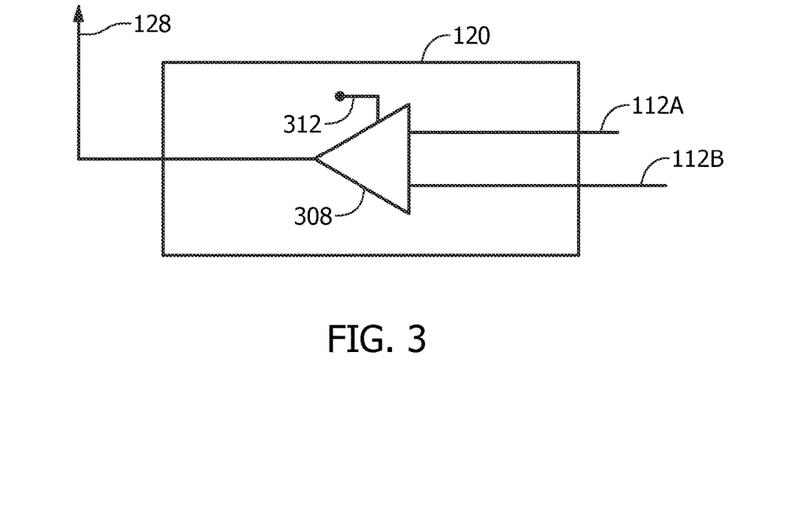
FIG. 3 illustrates an example embodiment of a feedback circuit.

FIG. 3 illustrates a block diagram of an example embodiment of a feedback circuit. This is but one possible embodiment of a feedback circuit configured to perform as described herein. It is contemplated that other configuration are possible which do not depart from the claims the follow. As shown, the feedback circuit 120 includes inputs 112A, 112B as shown in FIG. 1. The inputs 112A, 112B connect to a buffer 308 that has gain that is configured to receive and amplify the output of the TIA (FIG. 1). The buffer 308 also receives a bias signal 312 as shown. The output of the buffer 308 is provided on output 128, which is reference in FIG. 1.

Although shown as a buffer 308 with gain, an amplifier may be used, such as an operational amplifier(s), gain stage(s), or any other type device capable of providing feedback with gain to the output 128. The buffer 308 (or other device capable of performing as described herein) should have a bandwidth that is greater than the bandwidth of the TIA being tested. If the buffer 308 bandwidth is less than the bandwidth of the TIA, then the buffer 308 will limit the oscillation frequency of the TIA, leading to an inaccurate reading of the actual bandwidth (oscillation rate) of the TIA. Under the Barkhausen criteria, the loop gain should be Modulus $(Z_T * G_F) >$ or $= 1$, where $Z_T$ is the transimpedance gain of the TIA and $G_F$ is the gain of the buffer (with gain) or amplifier 308. The phase shift or offset between the input signal and the feedback signal should be such that an overlap between these two signals creates the unstable oscillation based on the Barhausen criteria: Argument $(Z_T * G_F) = 0$.

Figure 4:
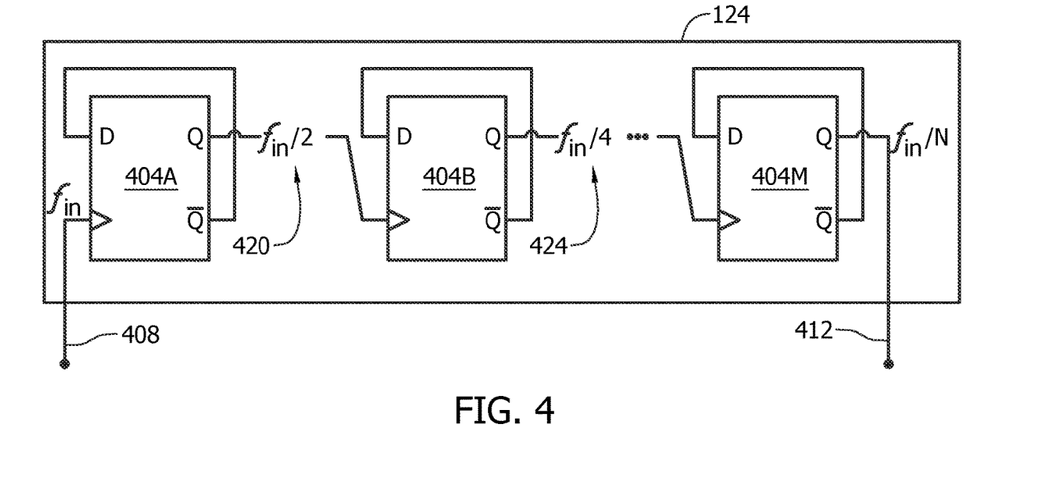
FIG. 4 illustrates an example embodiment of a frequency divider circuit.

FIG. 4 illustrates an example embodiment of a frequency divider circuit. Other configuration and types of frequency divider circuits or clock divider circuits are contemplated to divide down the frequency of TIA oscillation signal. The frequency division may occur in the analog or digital domain. To aid in understanding, this embodiment is shown in a single-ended configuration but is understood that this may be enabled in the differential mode configuration. As shown, the frequency divider 124 receive an input oscillation of frequency $f_{in}$ on an input 408 and performs frequency division to create an output oscillation of frequency $f_{in}/N$ on an output 412. The input 408 connects to a clock input of a first flip-flop 404A, which in this embodiment is a D flip-flop with the not-Q output fed back to the D (data) input. The flip-flop may be a combination of two latches. The flip-flop 404A divides the frequency by a factor of two to generate an output 420. Flip-flop operation is well known in the art, and as such is not described in detail. In other embodiments, divide factors other than two may be established.

The output of the first flip-flop 404A feeds into a second flip-flop 404B, which also performs a divide by two operation on the frequency of the received signal to create an output signal 424 which has ¼ the frequency of the input signal. This may occur multiple times until the last flip-flop 404M, with each flip-flop reducing the frequency of the signal to generate the output which has a frequency Fin/N where N is any whole number. This reduces the frequency of the TIA oscillation so that it can be more easily measured by the test equipment or other means, which would otherwise be challenging or expensive to measure the frequency of the TIA oscillation rate. After measurement, the measured frequency of the frequency divider output on output 412 may be multiplied by a value to calculate the actual maximum bandwidth of the TIA.

Although FIG. 1 illustrates a differential output from the TIA, it is contemplated that the systems and methods described herein may be implemented in single ended or differential mode configuration. In addition, the feedback systems and frequency dividers may be implemented in the analog domain, digital domain, or a combination of both.

Figure 5:
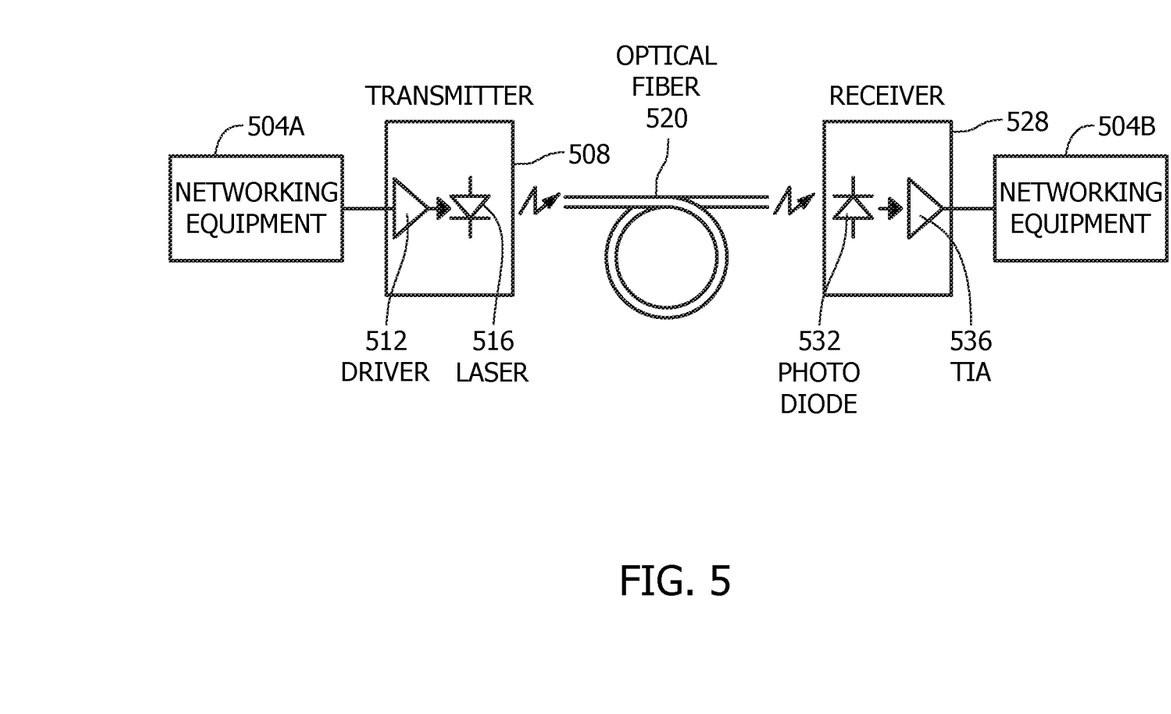
FIG. 5 illustrates an exemplary optic fiber communication link.

One example environment of use of the innovation disclosed herein is in an optical communication system that utilizes optical fiber links and lasers/LED or some other form of optic signal generator (light source). FIG. 5 illustrates an exemplary optic fiber communication link. To enable communication between remote networking equipment 504A, 504B, a fiber optic transmitter 508 and receiver 528 are provided. Laser drivers 512, which are part of a transmitter 508, drive the lasers 516 with a bias current and modulating current which in turn produces a modulated optic output signal from the laser. This optical output is coupled into the optical fiber 520 for signal transmission. At the receiving side of the optical fiber link is a receiver 528. The receiver 528 includes a photodiode (photodetector) 532 and one or more amplifiers (although only one amplifier is shown to simplify FIG. 5). The amplifier 536 may be a TIA or any other type amplifier or amplifiers. As used herein, the term amplifier means one or more amplifiers. Optical energy is converted into an electrical signal by the photodiode 532 and processed further by the one or more amplifiers 536 to set the signal magnitude to a level suitable for further processing. It is contemplated that the innovation disclosed herein may be used in other environments of use than that shown in FIG. 5 to characterize the TIA so that TIA operation at an expected bandwidth can be verified through testing. For example, it may find application in LIDAR (light detection and ranging) systems.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A system for determining a maximum bandwidth of an amplifier comprising:
   an amplifier having an amplifier input and an amplifier output, the amplifier output providing an amplifier output signal from the amplifier;
   a feedback system connected to the amplifier input and the amplifier output, the feedback system configured to:
   receive the amplifier output signal;
   process the amplifier output signal to create a feedback signal that forces the amplifier to become unstable and to increase the amplifier's oscillation rate until the amplifier's maximum oscillation rate is achieved, wherein the processing does not limit the bandwidth of the feedback signal;
   continually provide the positive feedback signal to the amplifier input, which causes the amplifier to become unstable and increase the amplifier's oscillation rate until the amplifier reaches the amplifier's maximum oscillation rate; and
   a frequency divider system having an input connected to the amplifier output, the frequency divider system configured to reduce the frequency of the amplifier output signal to create a reduced frequency signal; and
   an output configured to provide the reduced frequency signal to test equipment which is configured to measure the frequency of the reduced frequency signal, but which is not capable of measuring the maximum oscillation rate.

2. The system of claim 1 wherein the amplifier is a transimpedance amplifier.

3. The system of claim 1 wherein the feedback system is configured to provide an in-phase or partly in-phase version of the amplifier output to the amplifier input as the feedback signal.

4. The system of claim 1 wherein the feedback signal provided to the amplifier input forces the amplifier to oscillate, such that the oscillation rate is determined by the bandwidth of the amplifier.

5. The system of claim 1 further comprising a frequency detector configured to receive and determine a frequency of the reduced frequency signal, such that the frequency of the reduced frequency signal is related to the bandwidth of the amplifier.

6. The system of claim 1 further comprising a summing junction configured to combine the amplifier input and the feedback signal.

7. A method for determining a maximum bandwidth of an amplifier comprising:
   providing the amplifier having an amplifier input and an amplifier output;
   biasing the amplifier;
   generating an amplifier output signal;
   processing the amplifier output signal to generate a feedback signal, the feedback signal comprising an in-phase or partly in-phase version of the amplifier output signal;
   providing the feedback signal to the amplifier input for a period of time to cause the amplifier to become unstable and increase a rate of oscillation until a maximum frequency of the amplifier is reached to thereby generate an oscillating amplifier output which is at the amplifier's maximum oscillation frequency;
   dividing the frequency of the oscillating amplifier output by a dividing value to create a reduced frequency signal;
   monitoring the reduced frequency signal to determine if the rate of oscillation of the reduced frequency signal is stable due to the frequency of the reduced frequency signal no longer changing;
   responsive to the rate of oscillation of the reduced frequency signal no longer changing, detecting the frequency of the reduced frequency signal; and
   multiplying the frequency of the reduced frequency signal by the dividing value to calculate the frequency of the oscillating amplifier output which determines the maximum bandwidth of the amplifier.

8. The method of claim 7 wherein the amplifier comprises a transimpedance amplifier.

9. The method of claim 7 wherein the method occurs after manufacture to test and characterize the amplifier.

10. A system for generating a signal that represents an amplifier's maximum bandwidth comprising:
    a feedback system connected to an amplifier input and an amplifier output, the feedback system configured to provide feedback to the amplifier input for a period of time to force the amplifier to ramp up its rate of oscillation due to the feedback until a maximum oscillation frequency for the amplifier is reached, wherein the feedback system has a bandwidth equal to or greater than the amplifier;
    a frequency divider system having an input connected to the amplifier output, the frequency divider system configured to reduce the frequency of the amplifier output signal to create a reduced frequency signal; and
    a first switch bank, responsive to a control signal, comprising one or more switches configured to selectively connect the amplifier output to the feedback system and the frequency divider;
    a second switch bank, responsive to the control signal, comprising one or more switches, configured to selectively connect the feedback system to the amplifier input; and
    an output configured to provide the reduced frequency signal to test equipment configured to measure the frequency of the reduced frequency signal such that the oscillation frequency represents the amplifier maximum bandwidth.

11. The system of claim 10 wherein the amplifier is a transimpedance amplifier.

12. The system of claim 10 wherein the feedback system is configured to provide an in-phase or partly in-phase version of the amplifier output to the amplifier input as the feedback signal to force oscillation of the amplifier.

13. The system of claim 10 wherein the oscillation frequency of the amplifier is determined by the amplifier's bandwidth.

14. The system of claim 10 further comprising a frequency detector configured to receive and determine a frequency of the reduced frequency signal, such that the frequency of the reduced frequency signal is related to the bandwidth of the amplifier.

15. The system of claim 10 further comprising a summing junction configured to combine the amplifier input and the feedback signal.

16. The system of claim 10 wherein the system includes the amplifier, and the amplifier is a transimpedance amplifier.

17. The system of claim 10 where in the feedback system comprises a combination of any passive elements, active elements, or both.

* * * * *